(12) United States Patent
Zhang et al.

(10) Patent No.: US 8,371,542 B2
(45) Date of Patent: Feb. 12, 2013

(54) SLIDE RAIL ASSEMBLY

(75) Inventors: Guang-Yi Zhang, Shenzhen (CN); Jia-Qi Fu, Shenzhen (CN); Hai-Chen Zhou, Shenzhen (CN); Lin-Ren Gu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 55 days.

(21) Appl. No.: 12/960,345

(22) Filed: Dec. 3, 2010

(65) Prior Publication Data

US 2012/0061551 A1  Mar. 15, 2012

(30) Foreign Application Priority Data

Sep. 13, 2010 (CN) .......................... 2010 1 0279735

(51) Int. Cl.
*A47B 88/00* (2006.01)

(52) U.S. Cl. ............. 248/220.21; 248/298.1; 248/224.8; 312/333

(58) Field of Classification Search ............... 248/298.1, 248/220.21, 220.22, 221.11, 221.12, 222.11, 248/222.41, 224.8; 312/333, 348.1, 334, 312/47, 46, 334.45, 334.44

See application file for complete search history.

(56) References Cited

U.S. PATENT DOCUMENTS

| | | | | |
|---|---|---|---|---|
| 6,375,290 | B1 * | 4/2002 | Lin et al. .................. | 312/334.46 |
| 6,945,619 | B1 * | 9/2005 | Chen et al. ............... | 312/334.47 |
| 7,101,081 | B2 * | 9/2006 | Chen et al. ................ | 384/21 |
| 7,654,624 | B2 * | 2/2010 | Huang et al. .............. | 312/333 |
| 7,726,755 | B2 * | 6/2010 | Peng et al. ............... | 312/334.46 |
| 7,758,134 | B2 * | 7/2010 | Huang ...................... | 312/334.47 |
| 8,007,060 | B2 * | 8/2011 | Duan et al. ............... | 312/334.44 |

* cited by examiner

*Primary Examiner* — Terrell McKinnon
*Assistant Examiner* — Steven Marsh
(74) *Attorney, Agent, or Firm* — Altis Law Group, Inc.

(57) ABSTRACT

A slide rail assembly includes a first rail, a second rail slidably received in the first rail, a mounting bracket fixed to the second rail, a positioning member movably mounted to the mounting bracket, and a releasing member slidably mounted to the second rail. The first rail includes a holding portion. The positioning member engages with the holding portion to prevent the second rail from sliding into or out of the first rail. By sliding the releasing member, the releasing member drives the positioning member to disengage from the holding portion of the first rail, thereby enabling the second rail to slide into or out of the first rail.

12 Claims, 10 Drawing Sheets

SLIDE RAIL ASSEMBLY

BACKGROUND

1. Technical Field

The present disclosure relates to a slide rail assembly.

2. Description of Related Art

Some slide rails used for mounting a server to a rack include a first rail fixed to a side of the rack, and a second rail fixed to a side of the server and slidable in the first rail, and the server is able to be drawn out of or pushed into the rack. Although this way is convenient for accessing the server, it is easy for the second rail to become disengaged from the first rail accidently, which could allow the server to fall and be damaged.

BRIEF DESCRIPTION OF THE DRAWINGS

Many aspects of the present embodiments can be better understood with reference to the following drawing. The components in the drawings are not necessarily drawn to scale, the emphasis instead being placed upon clearly illustrating the principles of the present embodiments.

Moreover, in the drawings, all the views are schematic, and like reference numerals designate corresponding parts throughout the several views.

DETAILED DESCRIPTION OF THE DESCRIPTION

Figure 1:
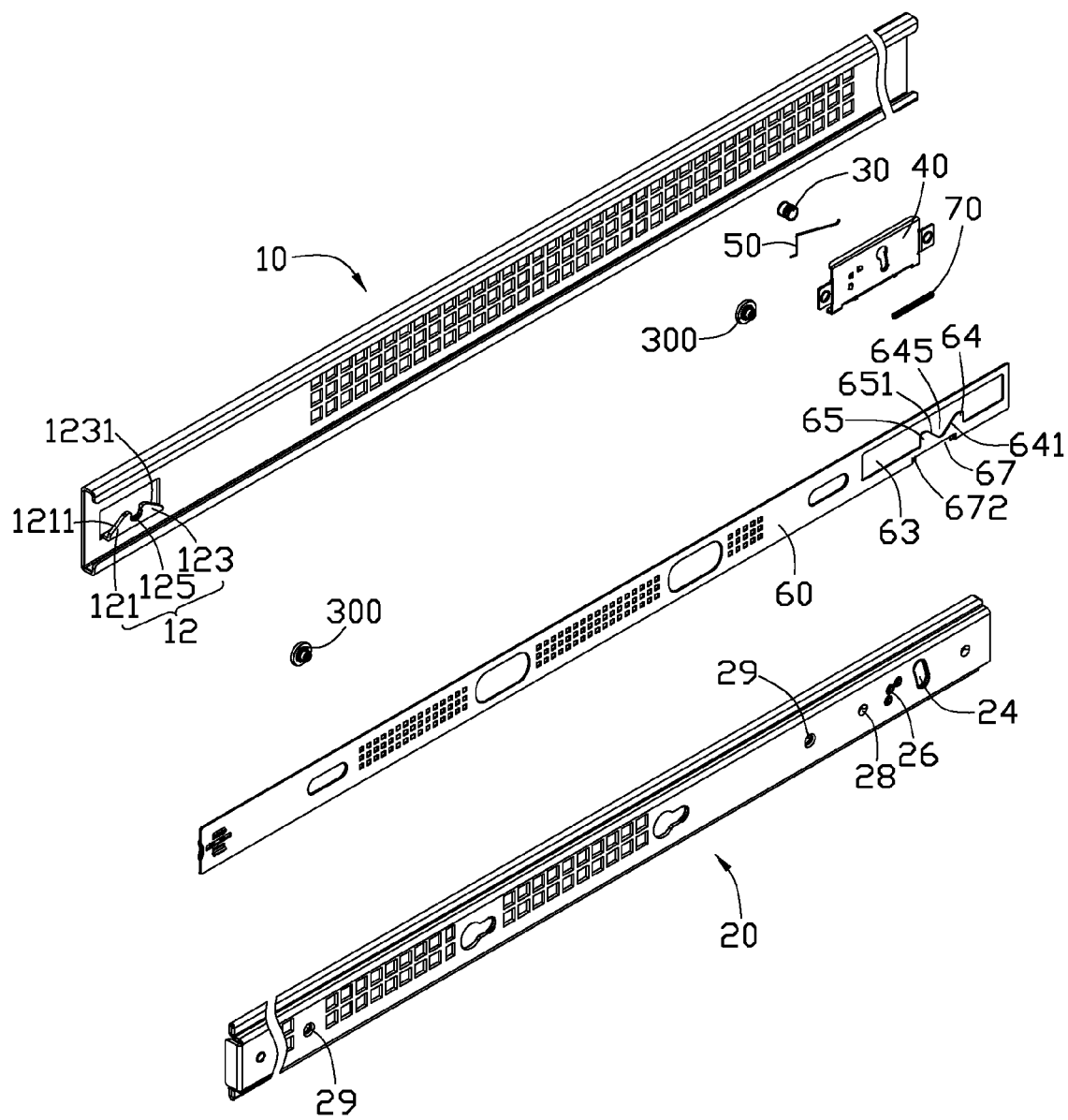
FIGS. 1 and 2 are exploded, isometric views of an embodiment of a slide rail assembly from different perspectives, the slide rail assembly including a first rail, a second rail, a positioning member, a mounting bracket, a releasing member, a first resilient member, and a second resilient member.
Figure 2:
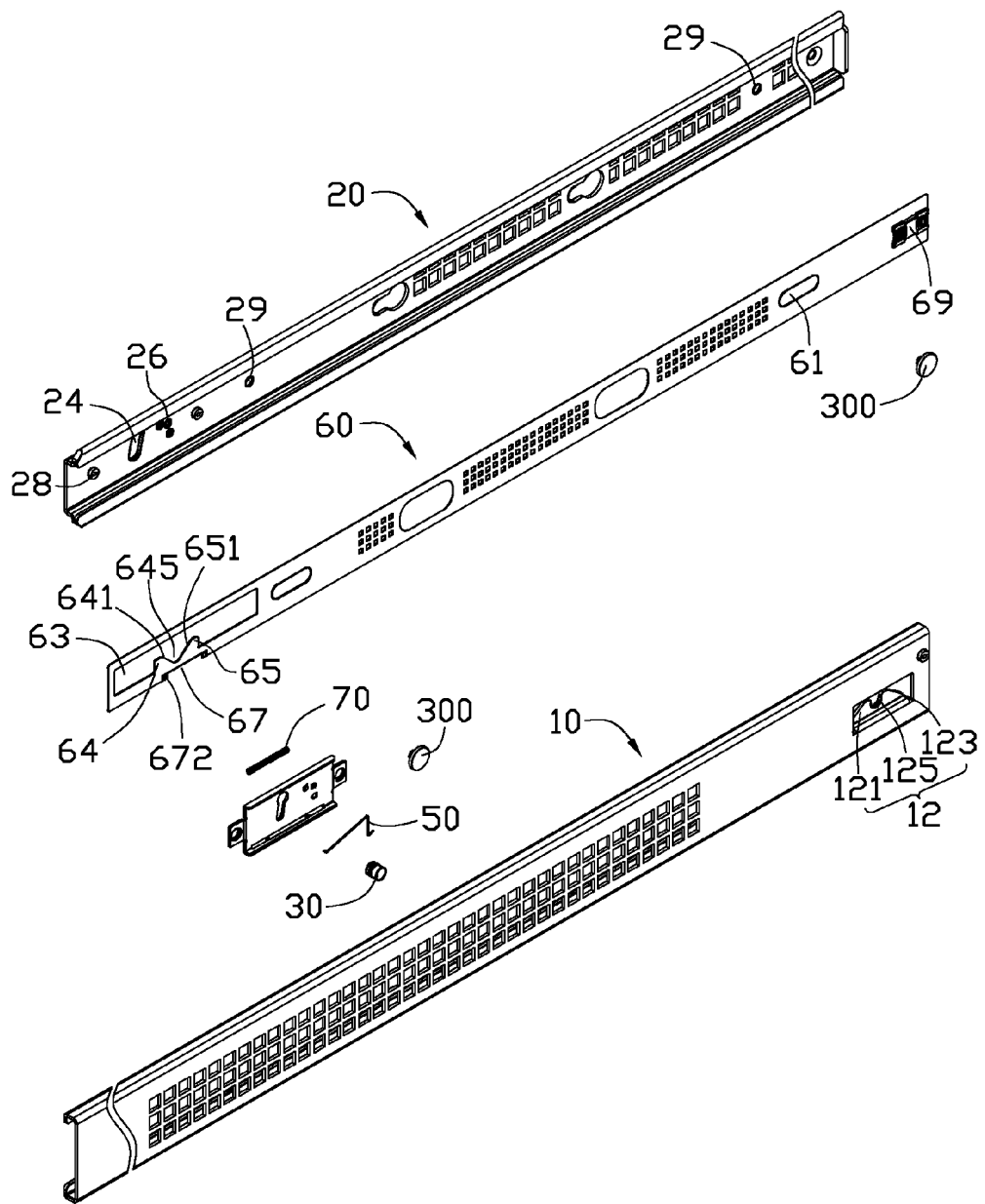

Referring to FIGS. 1 and 2, an embodiment of a slide rail assembly includes a first rail 10, a second rail 20 slidably received in the first rail 10, a positioning member 30, a mounting bracket 40, a releasing member 60, a first resilient member 50, and a second resilient member 70.

The first rail 10 defines a substantially C-shaped cross section, and includes a sidewall and top and bottom walls extending from opposite sides of the sidewall. A holding portion 12 is formed on the first rail 10 adjacent to an end of the first rail 10. The holding portion 12 includes a substantially wedge-shaped first block 121, a substantially wedge-shaped second block 123, which is a mirror image of the first block 121, and a positioning gap 125 defined between the first block 121 and the second block 123. The first block 121 and the second block 123 protrude in from the sidewall of the first rail 10. The first block 121 and the second block 123 are spaced from and aligned with each other in a longitudinal direction of the first rail 10. The first block 121 forms a sliding slope 1211 opposite to the positioning gap 125, and the second block 123 forms a sliding slope 1231 opposite to the positioning gap 125.

The second rail 20 defines a substantially C-shaped cross section, and includes a sidewall and top and bottom walls extending from opposite sides of the sidewall. Two securing posts 28 protrude from the sidewall of the second rail 20, adjacent to an end of the second rail 20. A slide slot 24 and three through holes 26 are defined in the sidewall of the second slide rail 20 between the securing posts 28. The slide slot 24 is slightly arced. Two spaced retaining holes 29 are defined in a middle of the sidewall of the second slide rail 20 in a longitudinal direction of the second rail 20.

Figure 3:
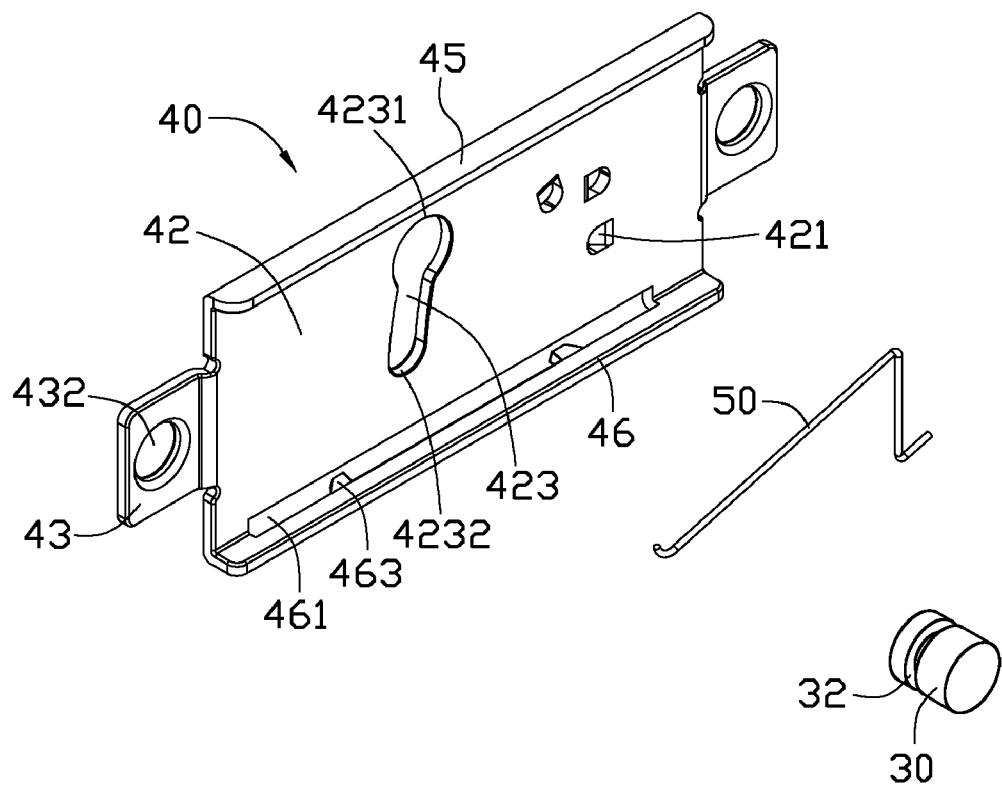
FIG. 3 is an enlarged, isometric view of the positioning member, the mounting bracket, and the first resilient member of FIG. 2.
Figure 4:
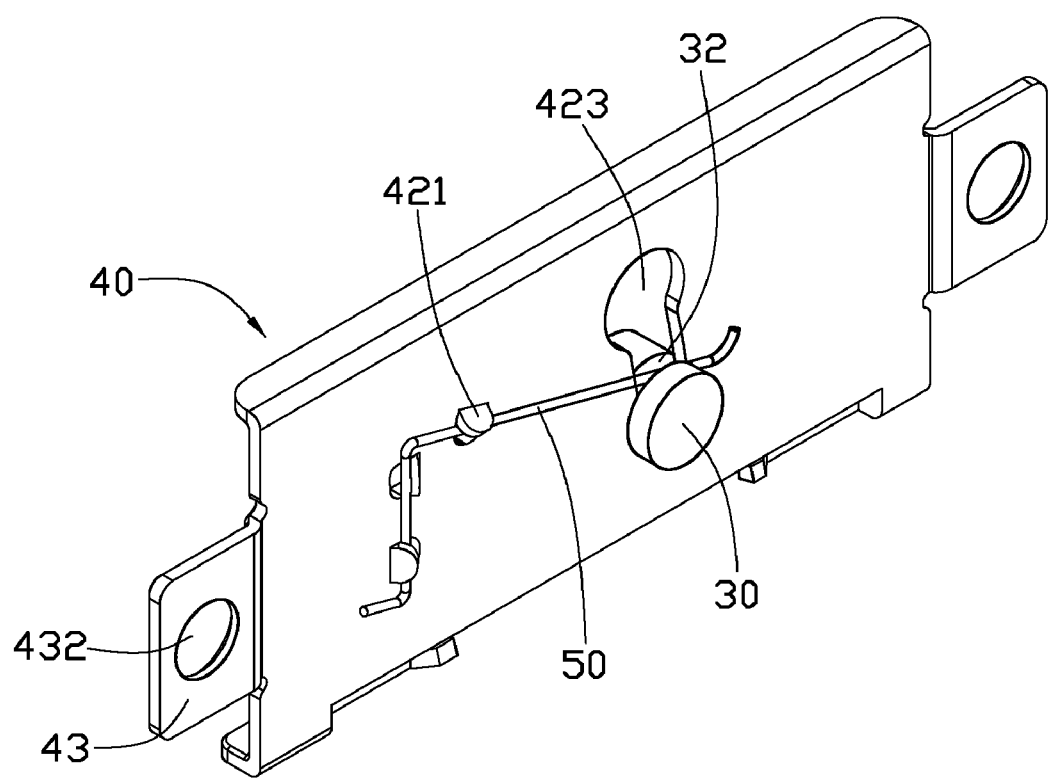
FIG. 4 is an assembled, isometric view of FIG. 3.
Figure 5:
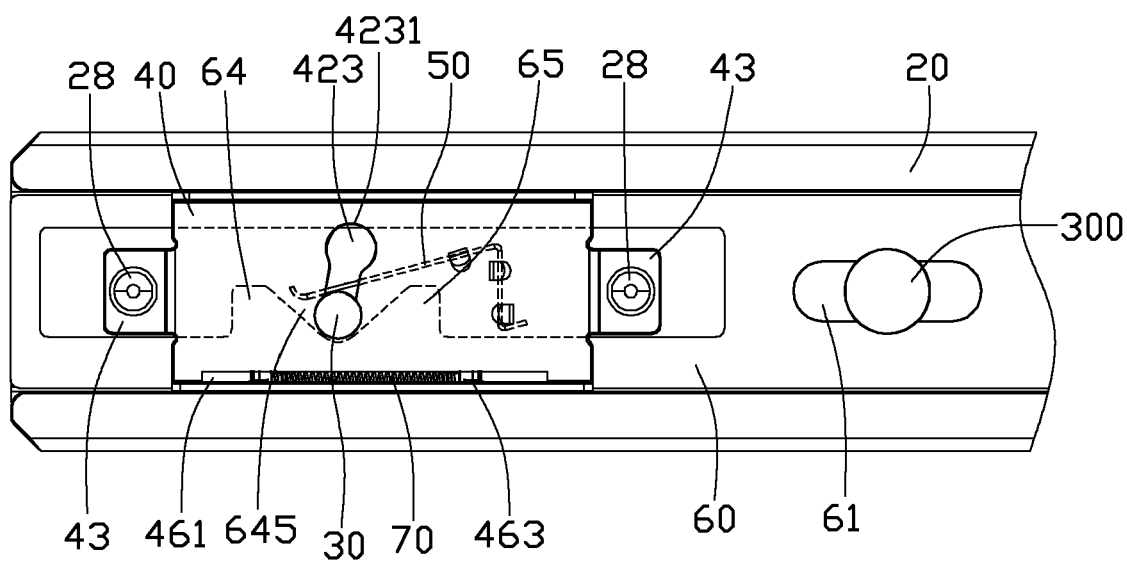
FIG. 5 is an assembled, side plan view of the second rail, the positioning member, the releasing member, the first resilient member, and the second resilient member of FIG. 2.

Referring to FIG. 3, the positioning member 30 is a cylinder defining an annular groove 32 in the circumferential face thereof.

The mounting bracket 40 includes a plate-shaped main body 42, a pair of ears 43 extending from opposite ends of the main body 42, a top flange 45 extending from a top side of the main body 42, and a bottom flange 46 extending from a bottom side of the main body 42. Three retaining tabs 421 slantingly extend from the main body 42 in different directions, and are arrayed in a triangle. A guide slot 423 is defined in the main body 42, adjacent to the retaining tabs 421. The guide slot 423 is slightly arced, and includes a first end 4231 with greater width and a second end 4232 with a lesser width. Each of the ears 43 is slightly raised from the main body 42, and defines a fixing hole 432. A long mounting slot 461 is defined at a conjunction of the bottom flange 46 and the main body 42. Two spaced stopping blocks 463 extend from a side of the bottom flange 46 bounding the mounting slot 461.

The first resilient member 50 is a bent metal wire.

The second resilient member 70 is a coil spring.

Referring to FIGS. 1 and 2 again, the releasing member 60 is a rectangular piece, and defines two spaced slide slots 61 aligned in a longitudinal direction of the releasing member 60, and a rectangular opening 63 adjacent to an end of the releasing member 60. A first driving tab 64 and a second driving tab 65 extend from a bottom side bounding the opening 63, and respectively include a first driving slope 641 and a second driving slope 651 facing each other to cooperatively bound a substantially V-shaped locating notch 645 between the first driving tab 64 and the second driving tab 65. A cutout 67 is defined in a bottom side of the releasing member 60, and aligned with the locating notch 645. Two protrusions 672 are respectively formed at opposite ends of the cutout 67. A grip 69 is attached to an end of the releasing member 60 far away from the opening 63.

Referring to FIGS. 1-5, in assembly, the positioning member 30 is inserted into the guide slot 423 from the fist end 4231 of the guide slot 423, and slid to the second end 4232 of the guide slot 423 with opposite sides bounding the guide slot 43 slidably engaging in the annular groove 32 of the positioning member 30. The first resilient member 50 is retained by the retaining tabs 421, with an end of the first resilient member 50 engaging in the annular groove 32 of the positioning member 30 to urge the positioning member 30 towards the second end 4232 of the guide slot 423.

The releasing member 60 is slidably coupled to the second rail 20, with two studs 300 extending through the slide slots 61 of the releasing member 60 and secured in the corresponding retaining holes 29 of the second rail 20. The second resilient member 70 is attached to the releasing member 60, with the second resilient member 70 received in the cutout 67 of the releasing member 60, and the protrusions 672 of the releasing member 60 extending into opposite ends of the second resilient member 70, respectively.

The mounting bracket 40, assembled with the positioning member 30 and the first resilient member 50, is attached to the second rail 20, with the securing pins 28 respectively riveted in the fixing holes 432 of the ears 43 of the mounting bracket 40, so that he guide slot 423 of the mounting bracket 40 is positioned to extend in a direction transverse to the longitudinal direction of the second slide rail 20. The mounting slot 461 of the mounting bracket 40 receives the second resilient member 70. Opposite ends of the second resilient member 70 respectively resist against the stopping blocks 463 of the mounting bracket 40. The positioning member 30 extends through the locating notch 645 of the releasing member 60 to be received in the slide slot 24. The retaining tabs 421 of the positioning member are received in the through holes 26 of the second rail 20.

In an original position of the releasing member 60, the positioning member 30 is disposed on a bottom of the locating notch 645.

Figure 6:
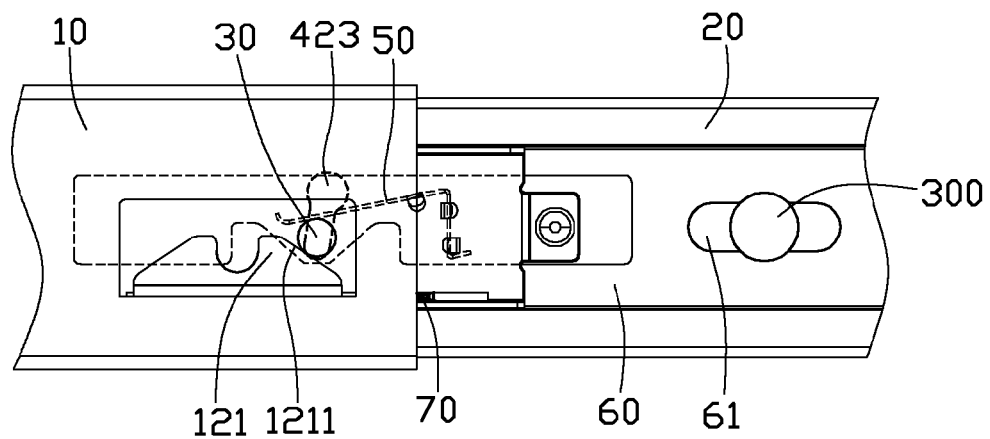
FIGS. 6-10 are assembled, side plan views of FIG. 2 in different using states.
Figure 7:
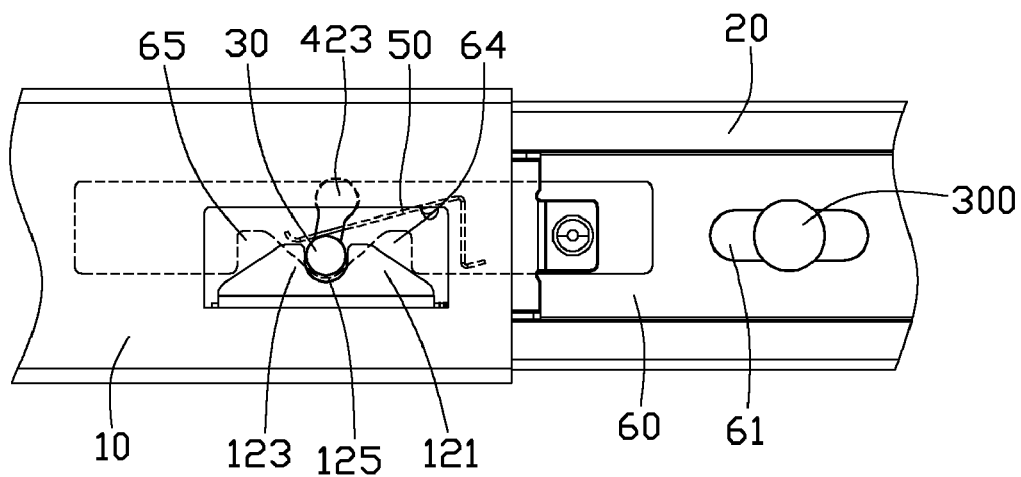

Referring to FIGS. 6-7, the second rail 20 is inserted into the first rail 10, and slid leftwards relative to the first rail 10 until the positioning member 30 engages with the first block 121 of the first rail 10. The second rail 20 is slid further left, so that the positioning member 30 is driven by the sliding slope 1211 of the first block 121 to move up along the guide slot 423 towards the first end 4231 of the guiding slot 423. The first resilient member 50 is deformed. When the positioning member 30 just moves over the first block 12, the mounting bracket 40 moves with the second rail 20 to make the guide slot 423 of the mounting bracket 40 almost align with the positioning gap 125 of the first rail 10 (shown in the FIG. 7). The first resilient member 50 is restored to drive the positioning member 30 to slide to the second end 3232 of the guide slot 423, and is retained in the positioning gap 125 of the first rail 10. Therefore, the second rail 20 is stopped from sliding further into or out of the first rail 10.

Figure 8:
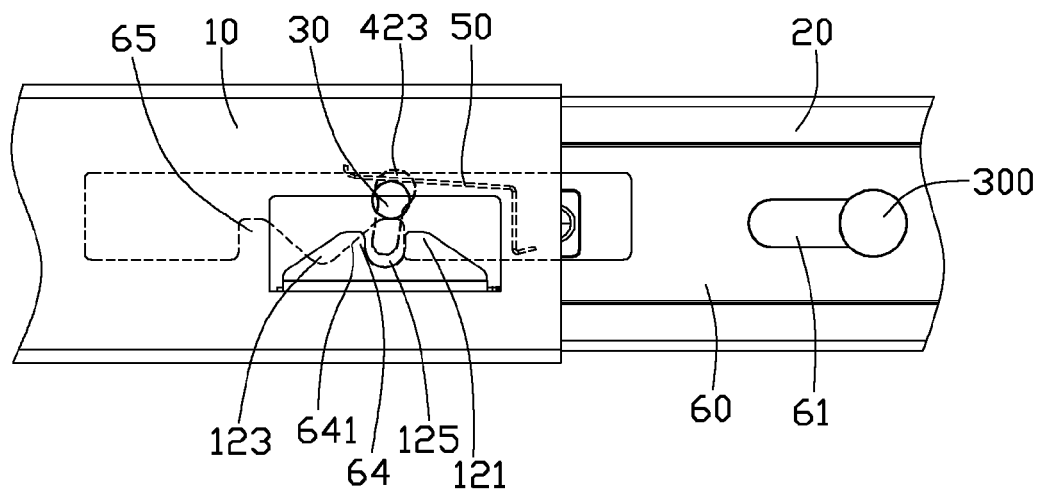

Referring to FIG. 8, to push the second rail 20 into the first rail 10 further, the grip 69 (shown in FIGS. 1 and 2) is manipulated to slide the releasing member 60 leftwards in the longitudinal direction of the second rail 20. The protrusions 672 of the releasing member 60 are moved relative to the stopping blocks 463 of the mounting bracket 40 to press the second resilient member 70. With the movement of the releasing member 60, the first driving slope 641 of the first driving tab 64 drives the positioning member 30 to slide along the guide slot 423 of the mounting bracket 40 towards the first end 4231 of the guide slot 423. When the releasing member 60 moves to a first releasing position, the positioning member 30 is disengaged from the positioning gap 125 of the first rail 10. Therefore, the second rail 20 is able to slide further into the first rail 10 to be fully received in the first rail 10. The releasing member 60 is released, therefore, the second resilient member 70 is restored to return the releasing member 60 to the original position, where the positioning member 30 is disposed on the bottom of the locating notch 645.

Figure 9:
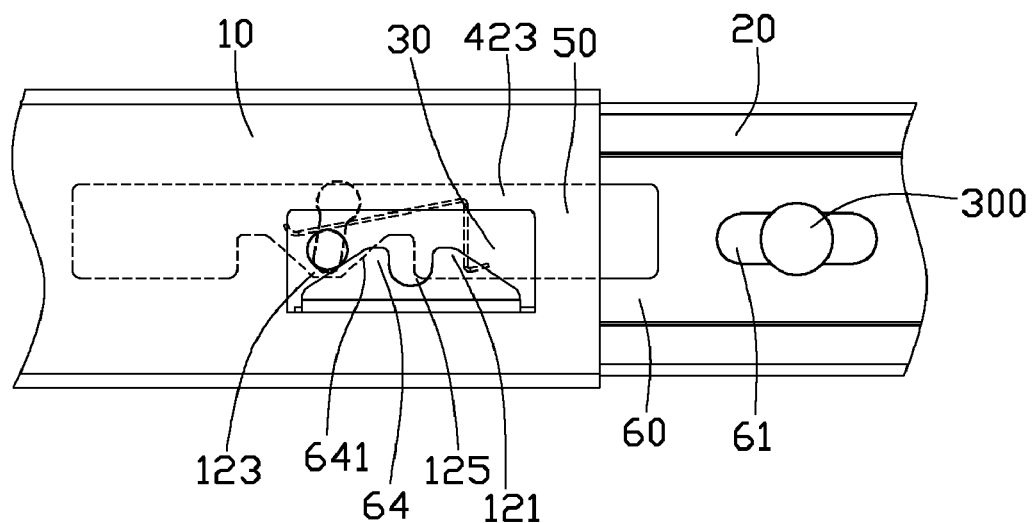

Referring to FIGS. 7-9, to extend the second rail 20 from the first rail 10, the second rail 20 is slid rightwards relative to the first rail 10 until the positioning member 30 engages with the second block 123. The second rail 20 is slid further right, so that the positioning member 30 is driven by the sliding slope 1231 of the second block 123 to move along the guide slot 423 towards the first end 4231 of the guide slot 423, with the first resilient member 50 being deformed. When the positioning member 30 just moves over the second block 12, the mounting bracket 40 moves with the second rail 20 to make the guide slot 423 of the mounting bracket 40 almost align with the positioning gap 125 of the first rail 10 (shown in the FIG. 7). The first resilient member 50 is restored to drive the positioning member 30 to slide to the second end 4232 of the guide slot 423, and retained in the positioning gap 125 of the first rail 10. Therefore, the second rail 20 is stopped from sliding further into or out of the first rail 10.

Figure 10:
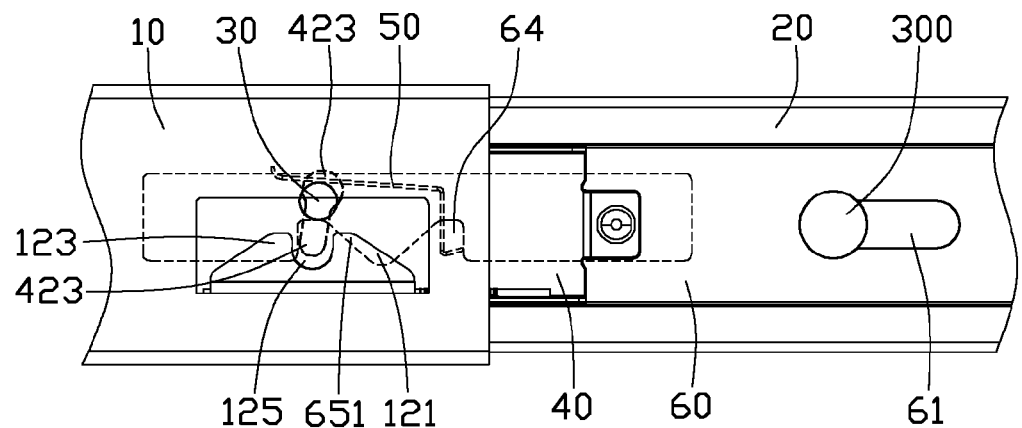

Referring to FIG. 10, to remove the second rail 20 from the first rail 10, the grip 69 (shown in FIGS. 1 and 2) is manipulated to slide the releasing member 60 rightwards in the longitudinal direction of the second rail 20. The protrusions 672 of the releasing member 60 are moved relative to the stopping blocks 463 of the mounting bracket 40 to press the second resilient member 70. With the movement of the releasing member 60, the second driving slope 651 of the second driving tab 65 drives the positioning member 30 to slide along the guide slot 423 of the mounting bracket 40 towards the first end 4231 of the guide slot 423. When the releasing member 60 moves to a second releasing position, the positioning member 30 is disengaged from the positioning gap 125 of the first rail 10. Therefore, the second rail 20 can be slid to the right and removed from the first rail 10.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A slide rail assembly comprising:
   a first rail comprising a holding portion;
   a second rail slidably received in the first rail;
   a mounting bracket secured to the second rail and defining a guide slot;
   a positioning member slidably received in the guide slot of the mounting bracket and engaging with the holding portion of the first rail to stop the second rail from sliding into or out of the first rail; and
   a releasing member slidably mounted to the second rail, wherein the releasing member drives the positioning member to disengage from the holding portion of the first rail in response to the releasing member sliding relative to the second rail;
   wherein the holding portion of the first rail comprises a wedge-shaped first block, and a wedge-shaped second block spaced from the first block, a positioning gap is defined between the first and the second blocks, the second rail is stopped from sliding relative to the first rail in response to the positioning member being received in the positioning gap of the holding portion of the first rail; and
   wherein the guide slot of the mounting bracket extends in a direction transverse to a longitudinal direction of the second slide rail.

2. The slide rail assembly of claim 1, wherein the first block and the second block each form a sliding slope opposite to the positioning gap.

3. The slide rail assembly of claim 1, wherein the positioning member is a cylinder defining an annular groove in the circumferential face of the positioning member, opposite sides of the mounting bracket bounding the guide slot are slidably engaged in the annular groove.

4. The slide rail assembly of claim 1, wherein the guide slot is arced.

5. The slide rail assembly of claim 1, further comprising a first resilient member mounted to the mounting bracket and engaging with the positioning member to urge the positioning member to the positioning gap of the first rail in response to the guide slot of the mounting bracket aligned with the positioning gap of the first rail.

6. The slide rail assembly of claim 1, wherein the releasing member comprises a first driving tab forming a first driving slope, a second driving tab forming a second driving slope facing the first driving slope, and a substantially V-shaped locating notch between the first and the second driving slope, the locating notch of the releasing member is aligned with the guide slot of the mounting bracket in response to the releasing member being at an original position where the positioning member is disposed on a bottom of the locating notch.

7. The slide rail assembly of claim 6, wherein the releasing member is slidable from the original position to a first releasing position where the positing member is driven by the first driving slope to slide along the guide slot of the mounting bracket to move out of the positioning gap, or to a second releasing position where the second the positing member is driven by the second driving slope to slide along the guide slot of the mounting bracket to move out of the positioning gap.

8. The slide rail assembly of claim 7, further comprising a second resilient member arranged between the mounting bracket and the releasing member to bias the positioning member to the original position.

9. The slide rail assembly of claim 8, wherein the second resilient member is a coil spring.

10. A slide rail assembly comprising:
a first rail comprising a holding portion;
a second rail slidably received in the first rail;
a mounting bracket secured to the second rail;
a positioning member mounted to the mounting bracket and movable between a lock position to stop the second rail from sliding into or out of the first rail and a releasing position to allow the second rail to slide relative to the first rail; and
a releasing member slidably mounted to the second rail, wherein the releasing member comprises a first driving tab forming a first driving slope, a second driving tab forming a second driving slope facing the first driving slope, and a substantially V-shaped locating notch between the first and the second driving slopes, the positioning member is disposed on a bottom of the locating notch in response to the positioning member at the lock position, and is driven by one of the first and second driving slope towards the releasing position with the releasing member sliding relative to the second rail.

11. The slide rail assembly of claim 10, further comprising a first resilient member mounted to the mounting bracket and engaging with the positioning member to bias the positioning member towards the locking position.

12. The slide rail assembly of claim 10, wherein the mounting bracket defines a guide slot, and the positioning member is slidably received in the guide slot.

* * * * *